(12) United States Patent
Liao et al.

(10) Patent No.: US 8,803,234 B1
(45) Date of Patent: Aug. 12, 2014

(54) HIGH VOLTAGE SEMICONDUCTOR DEVICE AND METHOD FOR FABRICATING THE SAME

(71) Applicant: Vanguard International Semiconductor Corporation, Hsinchu (TW)

(72) Inventors: Chih-Cherng Liao, Hsinchu (TW); Yun-Chou Wei, Hsinchu (TW); Pi-Kuang Chuang, Hsinchu (TW); Ching-Yi Hsu, Hsinchu (TW); Chih-Wei Lin, Hsinchu (TW); Wen-Chung Chen, Hsinchu (TW); Che-Hua Chang, Hsinchu (TW); Yung-Lung Chou, Hsinchu (TW); Chung-Te Chou, Hsinchu (TW); Cheng-Lun Cho, Hsinchu (TW); Ya-Han Liang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/846,657

(22) Filed: Mar. 18, 2013

(51) Int. Cl.
*H01L 29/66* (2006.01)
*H01L 21/4763* (2006.01)
*H01L 29/423* (2006.01)
*H01L 29/78* (2006.01)

(52) U.S. Cl.
CPC ........ *H01L 29/4238* (2013.01); *H01L 29/7816* (2013.01); *H01L 29/66681* (2013.01)
USPC .......................................... 257/335; 438/595

(58) Field of Classification Search
CPC ............ H01L 29/6659; H01L 29/7833; H01L 29/66545; H01L 29/4239; H01L 29/55581; H01L 29/7801; H01L 29/7835; H01L 29/1095
USPC .......................... 438/304, 267, 595; 257/335
See application file for complete search history.

(56) References Cited

U.S. PATENT DOCUMENTS

| | | | | |
|---|---|---|---|---|
| 5,599,726 A | * | 2/1997 | Pan | 438/304 |
| 5,663,586 A | * | 9/1997 | Lin | 257/336 |
| 6,031,266 A | * | 2/2000 | Honna | 257/336 |
| 6,991,973 B2 | * | 1/2006 | Chang et al. | 438/149 |
| 7,388,263 B2 | * | 6/2008 | Doong et al. | 257/401 |
| 7,820,517 B2 | * | 10/2010 | Gammel et al. | 438/301 |
| 8,178,399 B1 | * | 5/2012 | Masuoka et al. | 438/156 |
| 2004/0004259 A1 | * | 1/2004 | Wu | 257/411 |

* cited by examiner

*Primary Examiner* — William D Coleman
(74) *Attorney, Agent, or Firm* — Birch, Stewart, Kolasch & Birch, LLP (57) ABSTRACT

A high voltage (HV) semiconductor device includes: a semiconductor substrate having a first conductivity type; a gate structure disposed over a portion of the semiconductor substrate; a pair of spacers respectively disposed over a sidewall of the gate structure, wherein one of the spacers is a composite spacer comprising a first insulating spacer contacting the gate structure, a dummy gate structure, and a second insulating spacer; a first drift region disposed in a portion of the semiconductor, underlying a portion of the gate structure and one of the pair of spacers, having a second conductivity type opposite to the first conductivity type; and a pair of doping regions, respectively disposed in a portion of the semiconductor substrate on opposite sides of the gate structure, wherein the pair of doping regions include the second conductivity type and one of the doping regions is disposed in the first drift region.

15 Claims, 10 Drawing Sheets

FIG. 20

HIGH VOLTAGE SEMICONDUCTOR DEVICE AND METHOD FOR FABRICATING THE SAME

BACKGROUND OF THE INVENTION

1. Field of the Invention

The present invention relates to semiconductor fabrication, and in particular, to a high voltage (HV) semiconductor device and a method for fabricating the same.

2. Description of the Related Art

Recently, as demand for high voltage devices increase, there have been an increasing interest in research for high voltage metal oxide semiconductor field transistors (HV MOSFET) applied in high voltage devices.

Among the various types of high voltage metal oxide semiconductor field transistors, a double-diffused structure is often used at a source and drain of a high voltage metal oxide semiconductor field transistor. With such as double-diffused structure, the high voltage metal oxide semiconductor field transistor can sustain a higher breakdown voltage. A metal oxide semiconductor field transistor with a double-diffused structure may function as a high voltage device having a high operating voltage of about, for example, 10-30V.

However, with the trend for size reduction in semiconductor fabrication, a critical size of a high voltage device is also needed to be further reduced. Thus, a reliable high voltage semiconductor device with the double-diffused structure having a further reduced size is also needed to meet the needs and trends in the size reduction of high voltage devices.

BRIEF SUMMARY OF THE INVENTION

An exemplary embodiment of a high voltage (HV) semiconductor device comprises: a semiconductor substrate having a first conductivity type; a gate structure disposed over a portion of the semiconductor substrate; a pair of spacers respectively disposed over a sidewall of the gate structure, wherein one of the spacers is a composite spacer comprising a first insulating spacer contacting the gate structure, a dummy gate structure, and a second insulating spacer; a first drift region disposed in a portion of the semiconductor, underlying a portion of the gate structure and one of the pair of spacers, having a second conductivity type opposite to the first conductivity type; and a pair of doping regions, respectively disposed in a portion of the semiconductor substrate on opposite sides of the gate structure, wherein the pair of doping regions comprise the second conductivity type and one of the doping regions is disposed in the first drift region.

An exemplary embodiment for fabricating a high voltage semiconductor device comprises: providing a semiconductor substrate, having a first conductivity type; forming a drift region in a portion of the semiconductor substrate, wherein the drift region has a second conductivity type opposite to the first conductivity type; forming a gate structure and a dummy gate structure over the semiconductor substrate, wherein the gate structure partially covers the drift region, and the dummy gate structure is disposed over the drift region; forming a first insulating spacer and a pair of second insulating spacers, wherein the first insulating spacer is located between the gate structure and the dummy structure, and the second insulating spacers are respectively disposed over a sidewall of the dummy gate structure; performing an ion implanting process to form two doping regions in the semiconductor substrate adjacent to the second insulating spacers, wherein the doping regions have the second conductivity type, and one of the doping regions is formed in the drift region; and performing an annealing process.

Another exemplary embodiment of a method for fabricating a high voltage semiconductor device comprises: providing a semiconductor substrate, having a first conductivity type; forming a pair of drift regions in two different portions of the semiconductor substrate, wherein the drift regions have a second conductivity type opposite to the first conductivity type; forming a gate structure and a plurality of dummy gate structures over the semiconductor substrate, wherein the gate structure partially covers a portion of the drift regions and the dummy gate structures are respectively disposed over one of the drift regions; forming a first insulating spacer and a pair of second insulating spacers, wherein the first insulating spacer is located between the gate structure and the dummy structures, an the second insulating spacers are respectively disposed over a sidewall of the dummy gate structures; performing an ion implanting process to form two doping regions in the semiconductor substrate adjacent to the second insulating spacers, wherein the doping regions have the second conductivity type, and the doping regions is respectively disposed in one of the drift regions; and performing an annealing process.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
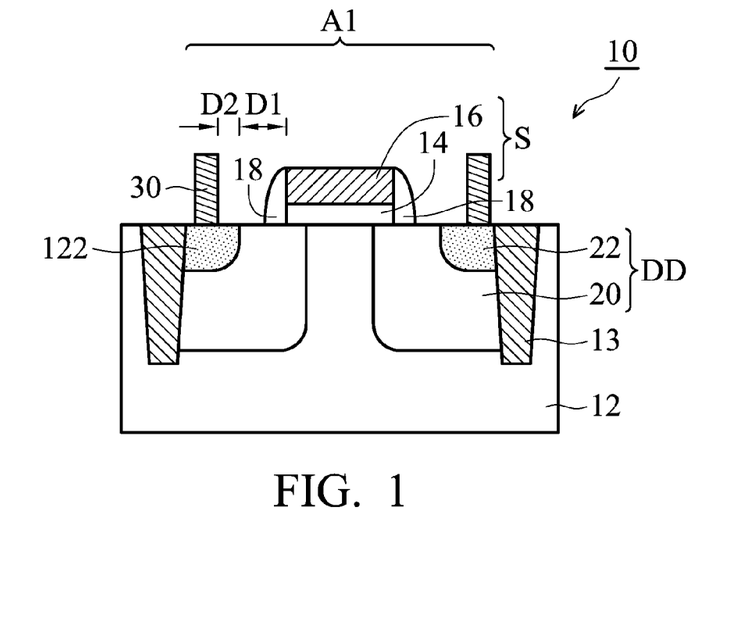
FIG. 1 is a schematic cross section of a high voltage semiconductor device according to an embodiment of the invention.
Figure 2:
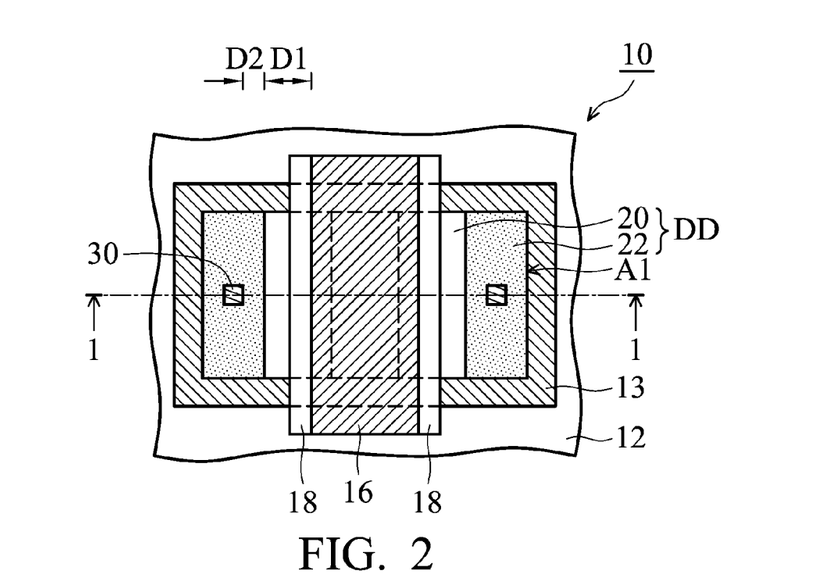
FIG. 2 is a schematic top view of the high voltage semiconductor device shown in FIG. 1.

FIGS. 1-2 are schematic diagrams respectively showing a top view and a cross section of an exemplary high voltage (HV) semiconductor device, wherein FIG. 1 shows a cross section taken along the line 1-1 in FIG. 2. In this embodiment, the HV semiconductor device comprises a double-diffused structure and is applicable with a high voltage operation of about, for example, 10-30 V.

Referring to FIGS. 1-2, a high voltage (HV) semiconductor device 10 is illustrated, comprising a semiconductor substrate 12, a gate structure S disposed over a portion of the semiconductor substrate 12, a double-diffused structure DD disposed in the semiconductor substrate 12 on both sides of the gate structure S, and a conductive contact 30 disposed over a portion of the double-diffused structure DD.

Still referring to FIGS. 1-2, an isolation structure 13 is disposed in the semiconductor substrate 12. From the top view, the isolation structure 13 (see FIG. 2) surrounds a portion of the semiconductor substrate 12, thereby defining an active region A1 for disposing a semiconductor device therein, and the gate structure S is disposed over a portion of the semiconductor substrate 12 in the active region A1. In FIG. 1, the gate structure S comprises a gate dielectric layer 14 and a gate electrode layer 16 is sequentially stacked over the semiconductor substrate 12. An insulating spacer 18 is respectively formed on opposite sidewalls of the gate dielectric layer 14 and the gate electrode layer 16 of the gate structure S, and the double-diffused structure DD comprises a drift region 20 disposed in a portion in the semiconductor substrate 12 and a doping region 22 disposed in a portion of the drift-region, wherein the drift regions 20 are partially disposed under the gate structure S, and the doping regions 22 function as a source/drain region for the HV semiconductor device 10. In one embodiment, the semiconductor substrate 12 is a substrate of a first conductivity type, for example a p-type silicon substrate, and the drift regions 20 and the doping regions 22 are regions of a second conductivity type opposite to the first conductivity type, for example n-type regions, wherein a dopant concentration of the second conductivity type in the doping regions 22 are ten times greater than that in the drift regions 20. The conductive contact 30 is disposed over a portion of each of the doping regions 22.

In the embodiments shown in FIGS. 1-2, the gate structure S, the doping regions 22, the drift regions 20, and the conductive contacts 30 are fabricated by performing various photolithography processes (not shown) to first form various patterned mask layers or photoresist layers (not shown) incorporated with an etching process or an ion implant process (both not shown). To ensure that the HV semiconductor device 10 shown in FIGS. 1-2 has a high breakdown voltage of about, for example, 10-30 V, a predetermined pitch D1 between the doping region 22 and a sidewall of the gate structure S adjacent thereto and a predetermined pitch D2 between the doping region 22 and a sidewall of the conductive contact 30 are limited to thereby control accuracies of the photolithography processes for forming the gate structure S, doping regions 22, drift region 20 and the conductive contact 30, and maintain the high breakdown voltage performance of the fabricated HV semiconductor device 10. In addition, due to the fact that fabrication of the doping regions 22 and the drift regions 20 of the HV semiconductor device 10 are achieved by two different photolithography processes (not shown) for forming various patterned mask layers or of the photoresist layers is incorporated with two different ion implant processes (not shown), the fabrication cost of the HV semiconductor device 10 is high. Thus, the fabrication of the doping regions 22 and the drift region 20 and limitations of predetermined pitches D1 and D2 are not conducive for cost reduction and size shrinkage of the HV semiconductor device 10.

FIGS. 3-10 are schematic diagrams showing various top views and cross sections of an exemplary embodiment of a method for fabricating a high voltage (HV) semiconductor device 100, wherein FIGS. 3, 5, 7, and 9 are cross sections showing various intermediate steps during fabrication of the HV semiconductor device 100, and FIGS. 4, 6, 8, and 10 are top views showing various intermediate steps during fabrication of the HV semiconductor device 100. FIGS. 3, 5, 7, and 9 respectively show a cross section taken along line 3-3 in FIG. 4, line 5-5 in FIG. 6, line 7-7 in FIG. 8, and line 9-9 in FIG. 10. The HV semiconductor device 100 and the method for fabricating the same in this embodiment have the advantages of, for example, size reduction and fabrication cost reduction, thereby solving the issues such as size reduction and fabrication cost reduction of the HV semiconductor device 10.

Figure 3:
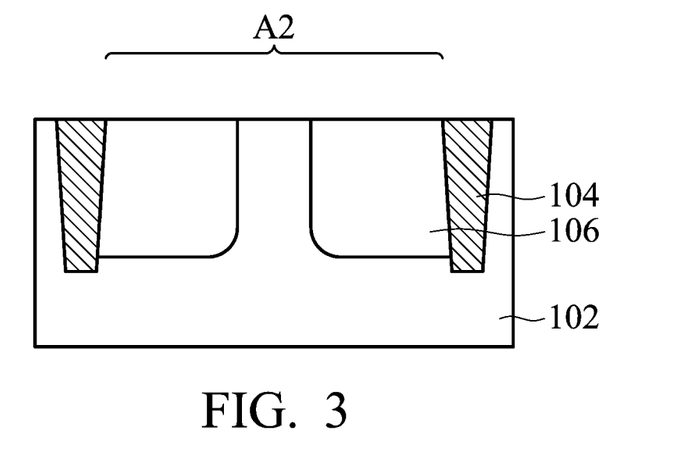
FIGS. 3, 5, 7, and 9 are schematic cross sections showing various intermediate stages in a method for fabricating a high voltage semiconductor device according to an embodiment of the invention, respectively.
Figure 4:
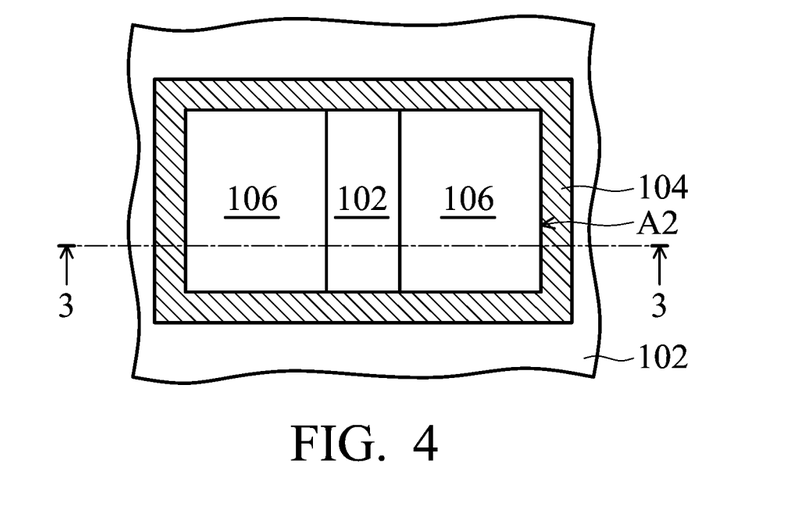
FIGS. 4, 6, 8, and 10 are schematic top views showing various intermediate stages in a method for fabricating a high voltage semiconductor device according to an embodiment of the invention.

In FIGS. 3-4, a semiconductor substrate 102 of a first conductivity type, such as p-type silicon substrate, is first provided. Next, a fabrication process such as shallow trench isolation (STI) process or a field oxidation (FOX) process is performed to form an isolation structure 104 in a portion of the semiconductor substrate 102. As shown in FIG. 4, the isolation structure 104 is illustrated with a substantially rectangular configuration from the top view, and the isolation structure 104 is illustrated with two portions in a cross section in FIG. 3. The isolation structure 104 formed in a portion of the semiconductor substrate 102 defines an active region A2 or fabrication of the high voltage (HV) semiconductor device 100 (see FIGS. 9-10). Next, an ion implantation process (not shown) is performed by use of a predetermined patterned mask layer incorporated with an ion implantation process (both not shown) to form two separating drift regions 106 in the semiconductor substrate 102. In one embodiment, the drift regions 106 are regions of a second conductivity type opposite to the first conductivity type, for example n-type regions.

Figure 5:
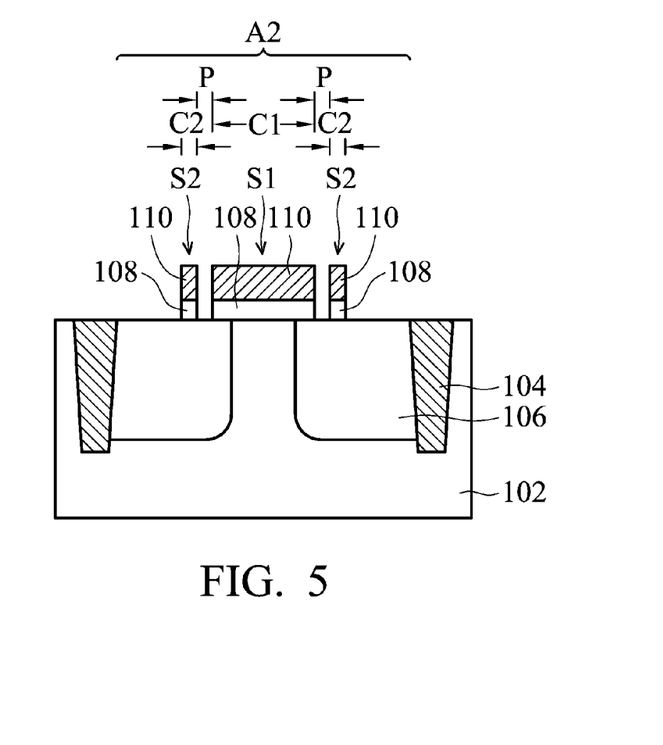
Figure 6:
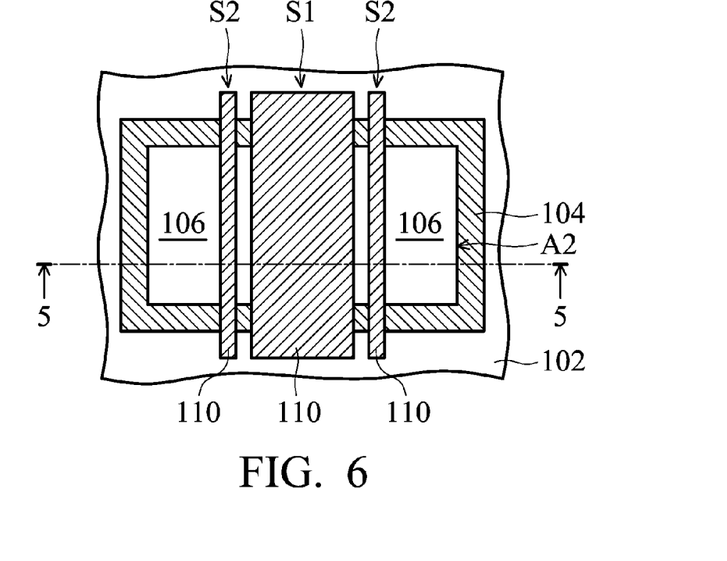

In FIGS. 5-6, a dielectric layer and a conductive layer (both not shown) are sequentially and blanketly formed over the semiconductor substrate and are then patterned, thereby forming a gate structure S1 and two dummy gate structure S2 over the semiconductor substrate 102 in the active region A2. As shown in FIGS. 5-6, the gate structure S1 is disposed over the semiconductor substrate 102 in the active region A2, partially covering a portion of the drift regions 106 adjacent thereto. The dummy gate structures S2 are respectively disposed adjacent to a side of the gate structure S1 and are located at a portion of each of the drift regions 106, respectively. From a top view, the gate structure S1 and the dummy gate structure S2 are formed with a strip configuration. Herein, the gate structure S1 and the dummy gate structures S2 respectively comprise a patterned dielectric layer 108 and a patterned conductive layer 110. In one embodiment, the dielectric layer 106 may comprise dielectric materials such as silicon oxide, silicon nitride, or high dielectric constant (high-k) dielectric materials, and the conductive layer 110 may comprise conductive materials such as polysilicon or metal. In addition, the gate structure S1 and the dummy gate structure S2 may respectively have a line width or a critical size C1 and C2, and a ratio between the C1 and C2 is about 5:1-20:1, and a pitch P is formed between the dummy gate structure S2 and the gate structure S1. A ratio between the pitch P and the C1 of the gate structure S1 is about 5:1-20:1. The gate structure S1 may function as a functional gate of the HV semiconductor device, and the dummy gate structure S2 may function as a part of a composite spacer (see FIGS. 7-10).

Figure 7:
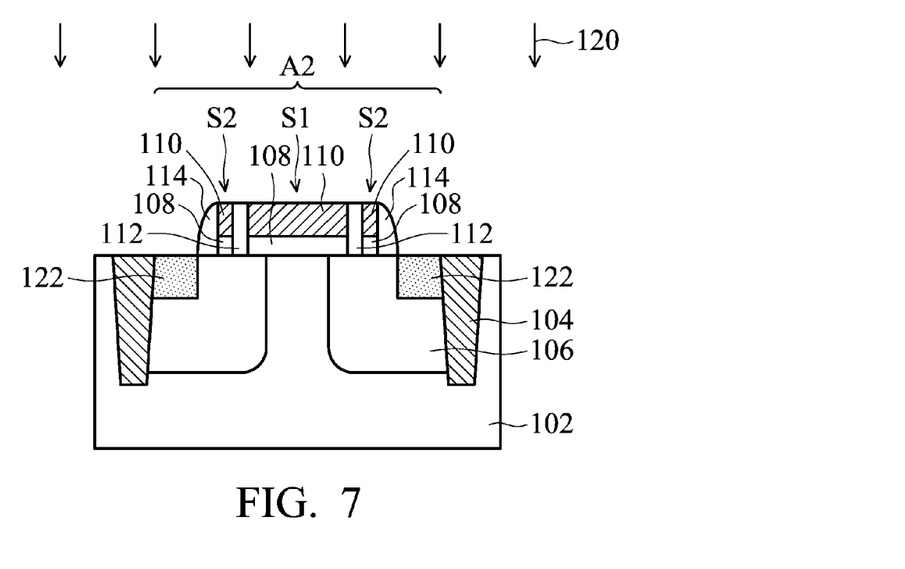
Figure 8:
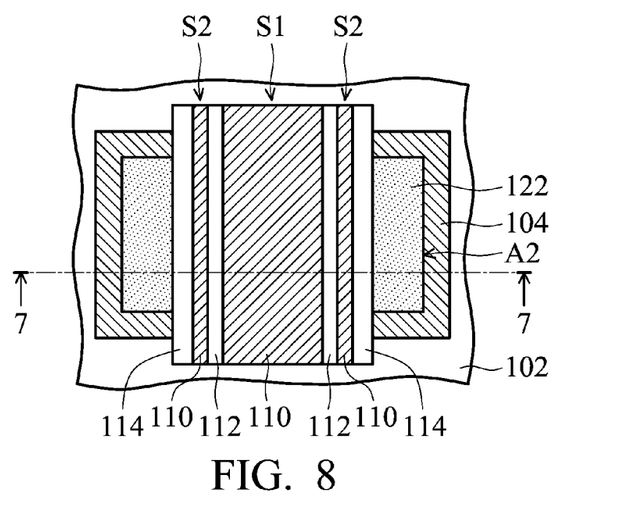

In FIGS. 7-8, a layer of insulating material (not shown), such as silicon oxide insulating material, is blanketly disposed over the structure shown in FIGS. 5-6, filling spaces between the gate structure S1 and the dummy gate structures S2. Next, an etching process (not shown) such as a dry etching process is performed to the layer of insulating material, thereby forming an insulating spacer 112 between the gate structure S1 and the dummy gate structures S2, and another insulating spacer 114 over a sidewall of the dummy gate structures S2. After formation of the insulating spaces 112 and 114, top surfaces of the gate structure S1 and the dummy structures S2 are exposed. Herein, the insulating spacers 112 are formed with a rectangular cross section, and the insulating spacers 114 are formed with a fan-like cross section.

Next, an ion implant process 120 is performed, using the gate structure S, the dummy gate structures S2, and the insulating spacers 112 and 114 as a implant mask, thereby forming self-aligned doping regions 122 adjacent to a side of the insulating spacers 114 in the drift region 106. The insulating spacers 112 formed between the gate structure S1 and the dummy gate structure S2 also prevent formation of undesired doping region being formed in the drift region 106 between the gate structure S1 and the dummy gate structures S2.

In one embodiment, the ion implanting process 120 dopes dopants having the second conductivity type to form the drift regions 106, thereby forming doping regions having the second conductivity type as that of the drift region 106, such as n-type regions. The doping regions 122 may have a dopant concentration which is 10 times greater than that of the drift regions 106, thereby functioning as a drain region or a source region.

Figure 9:
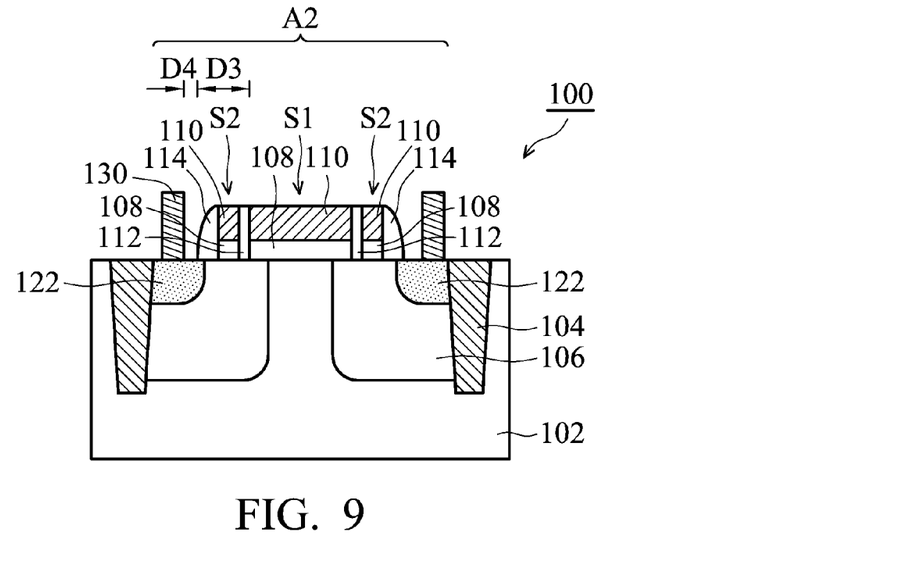
Figure 10:
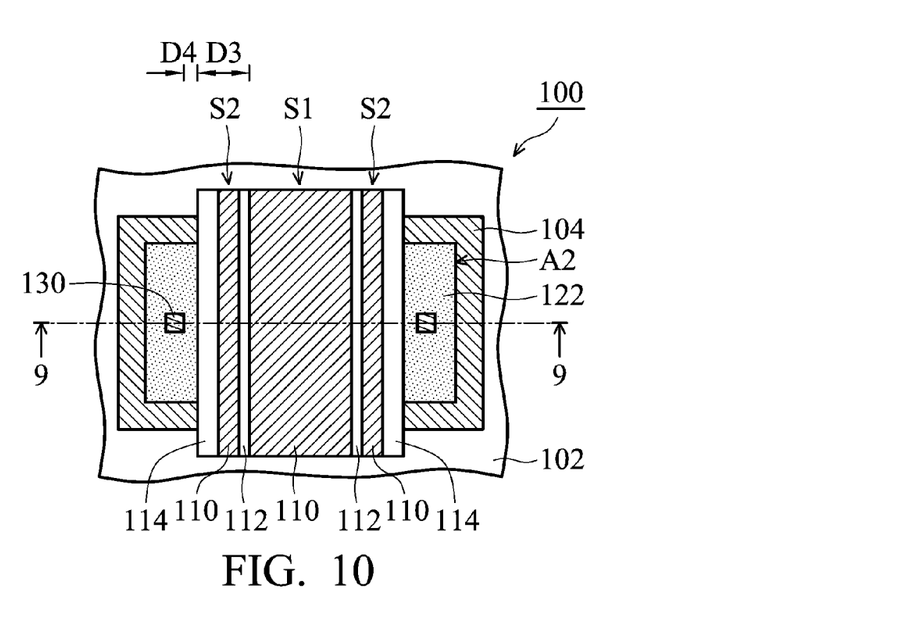

In FIGS. 9-10, after performing the anneal process (not shown), a high voltage semiconductor device 100 is formed. As shown in FIG. 9, after the anneal process, the doping regions 122 are further diffused to an area below the insulating spacers 114. Next, a conductive contact 130 is formed over a portion of each of the doping regions 122. In one embodiment, the conductive contact 130 may comprise metal materials such as tungsten, aluminum, or copper. Herein, as shown in FIG. 9, the dummy gate structures S2 on both sides of the gate structure S1 and the insulating spacers 112 and 114 form a composite spacer for the HV semiconductor device 100, and a pitch D3 is formed between the doping region 112 and a sidewall of the gate structure S1, and a pitch D4 is formed between the doping region 112 and a sidewall of the conductive contact 130. When compared with the pitch D1 formed between the gate structure S and the doping region 22 and the pitch D2 formed between the doping region 22 and the conductive contact 30 shown in FIGS. 1-2, the sum (D3+D4) of the pitch D3 and the pitch D4 between is about 50-80% that of the sum of the above described pitches D1 and D2 (D1+D2), such that a size of the active region S2 can be further reduced without changing the breakdown voltage of the HV semiconductor device 100, and the HV semiconductor device 100 may still have a breakdown voltage of, for example, about 10-30 V. In one embodiment, the breakdown voltage of the HV semiconductor device 100 can be further increased by increasing the pitch P (see FIG. 5) between the gate structure S1 and the dummy gate structure S2.

As shown in FIGS. 9-10, an improved HV semiconductor device 100 is provided, wherein due to formation of the composite spacer (including the dummy gate structure S2 and the insulating spacers 112 and 114), the doping region 122 of the double-diffused structure can be disposed more closer to the adjacent gate structure S1 without affecting the breakdown voltage of the HV semiconductor device 100, thereby allowing for further size reduction of the HV semiconductor device 100. Furthermore, since the doping regions 122 in the HV semiconductor device are formed by a self-aligning method but not by the conventional photolithography process incorporated with the patterned mask or photoresist layer, use of the photomask and related photolithography processes and materials can be reduced. This helps to reduce fabrication costs of the HV semiconductor device 100.

Figure 11:
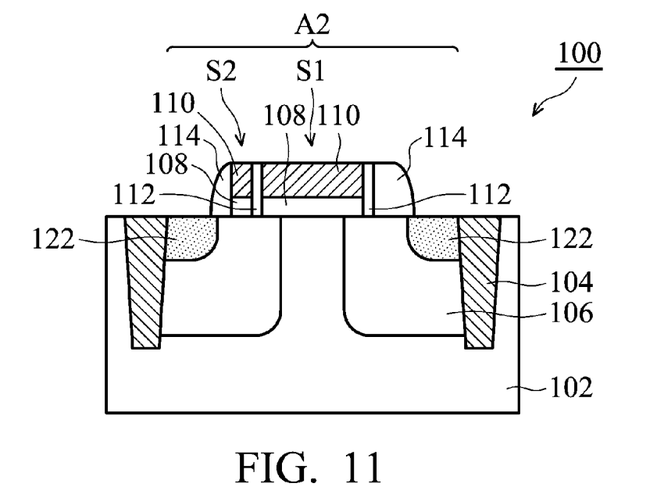
FIG. 11 is a schematic cross section of a high voltage semiconductor device according to another embodiment of the invention.
Figure 12:
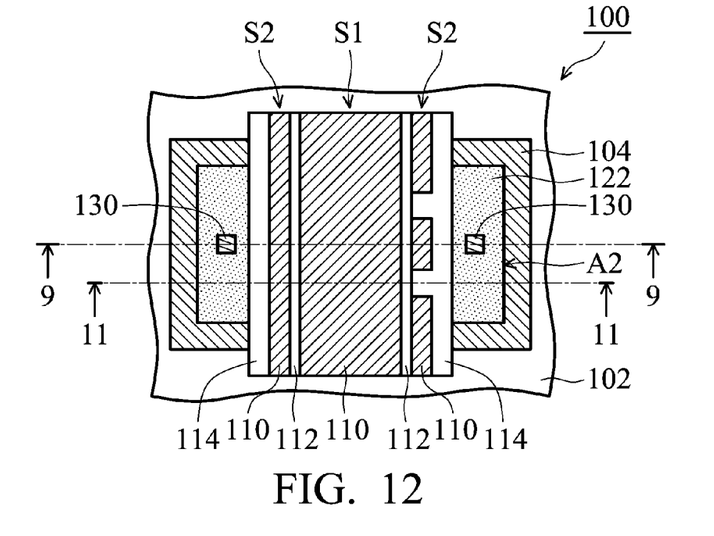
FIG. 12 is a schematic top view of the high voltage semiconductor device shown in FIG. 11.

In FIGS. 11-12, a schematic cross section and a schematic top view of another exemplary HV semiconductor device 100 are respectively illustrated. Herein, the HV device 100 is modified from the HV device 100 shown in FIGS. 9-10, and the same reference numbers in the FIGS. 11-12 represent the same components. For the purpose of simplicity, only differences between the two embodiments are discussed in follows.

In the top view shown in FIG. 12, in this embodiment, the dummy gate structure S2 at right side of the gate structure S1 is no longer formed with a continuous strip-like configuration, but is now formed as a plurality of interrupted strip segments 110. A cross section as shown in FIG. 9 is illustrated by line 9-9 in FIG. 12, and a cross section shown in FIG. 11 is illustrated by line 11-11 in FIG. 12, and a composite spacer comprising only the insulating spacers 112 and 114 are shown at a right side of the gate structure S1. The HV semiconductor device 100 shown in FIGS. 11-12 may still have the advantages and benefits which are similar with that of the HV semiconductor device 100 shown in FIGS. 9-10.

Figure 13:
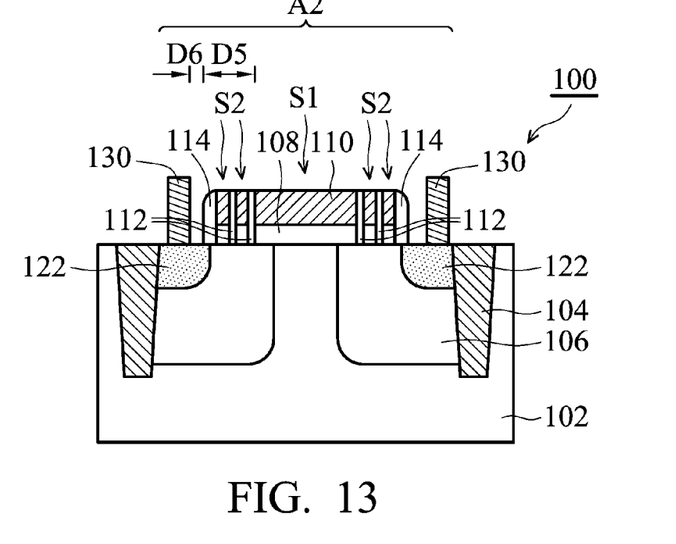
FIG. 13 is a schematic cross section of a high voltage semiconductor device according to yet another embodiment of the invention.
Figure 14:
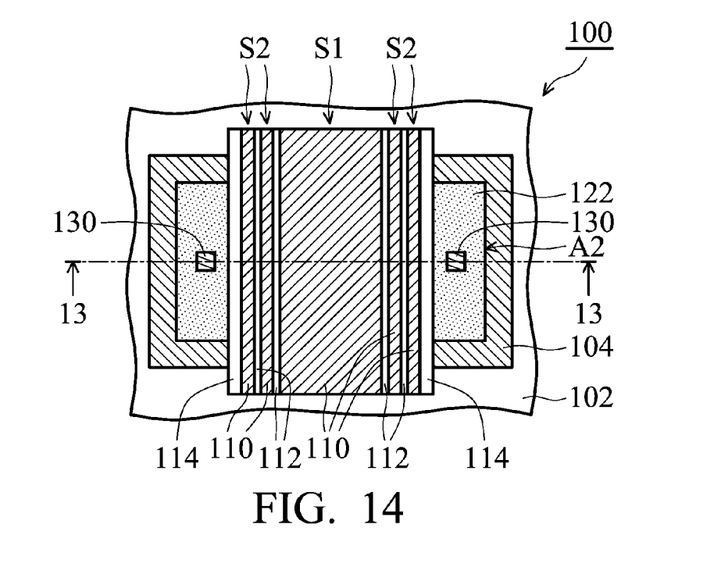
FIG. 14 is a schematic top view of the high voltage semiconductor device shown in FIG. 13.

In FIGS. 13-14, a schematic cross section and a schematic top view of another exemplary HV semiconductor device 100 are respectively illustrated. Herein the HV device 100 is modified from the HV device 100 shown in FIGS. 9-10, and the reference numbers in the FIGS. 13-14 represent the same components. For the purpose of simplicity, only differences between the two embodiments are discussed in follows.

As shown in FIGS. 13-14, in this embodiment, a plurality of dummy gate structures S2, for example two dummy gate structures S2, are disposed on opposite sides of the gate structures S1, and the schematic cross section in FIG. 13 is along line 13-13 in FIG. 14. In this embodiment, a pitch D5 is formed between the doping region 122 and a sidewall of the gate structure S1 and a pitch D6 is formed between the doping region 122 and a sidewall of the conductive contact 130. When compared with the pitch D1 formed between the gate structure S and the doping region 22 and the pitch D2 formed between the doping region 22 and the conductive contact 30 shown in FIGS. 1-2, the sum (D5+D6) of the pitch D5 and the pitch D6 in this embodiment is about 50-80% that of the sum of the above described D1 and D2 (D1+D2), such that a size of the active region S2 can be further reduced without changing the breakdown voltage of the HV semiconductor device 100, and the HV semiconductor device 100 may still have a breakdown voltage of, for example, about 10-30 V. The HV semiconductor device 100 shown in FIGS. 13-14 may still have the advantages and benefits which are similar with that of the HV semiconductor device 100 shown in FIGS. 9-12.

Components such as the composite spacers and double-diffused structures of the HV semiconductor devices 100 shown in FIGS. 9-10, 11-12, and 13-14 are symmetrically formed on opposite sides of the gate structure S1. However, in other embodiments, the above components in the HV semiconductor device 100 can be asymmetrically formed only on one side of the gate structure S1, such as the HV semiconductor device 100 illustrated in FIGS. 15-16 and 17-18.

Figure 15:
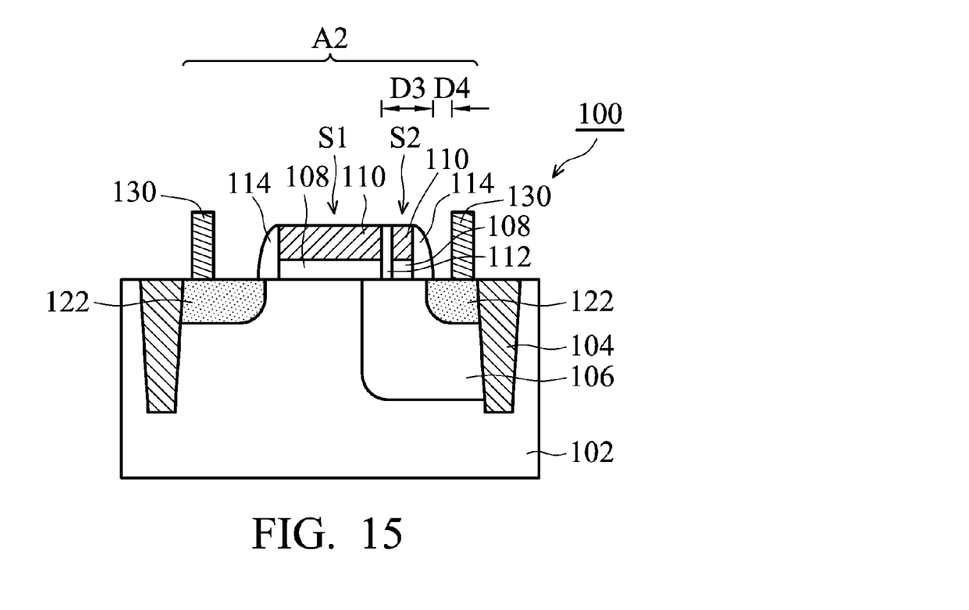
FIG. 15 is a schematic cross section of a high voltage semiconductor device according to another embodiment of the invention.
Figure 16:
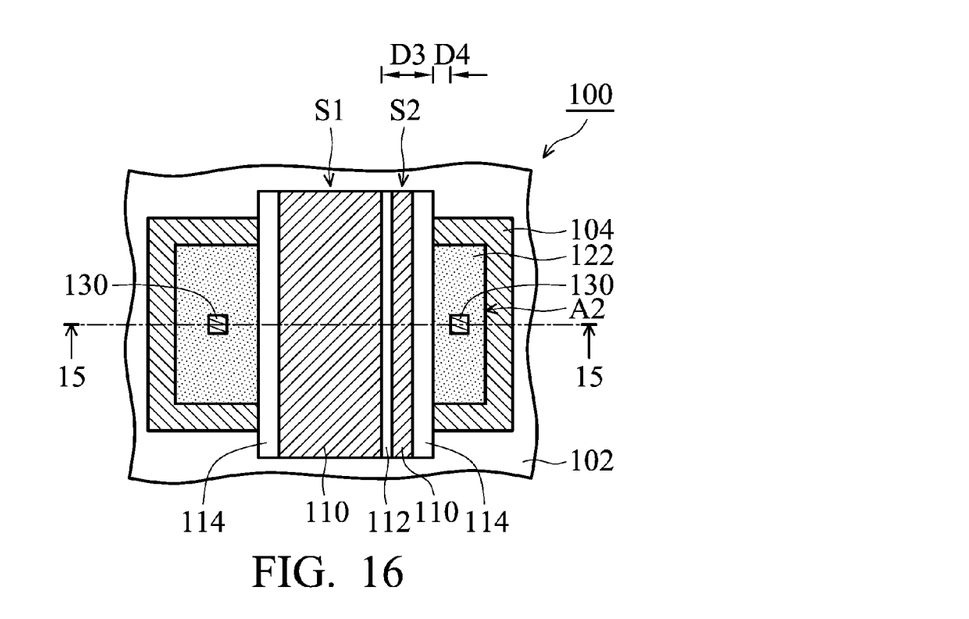
FIG. 16 is a schematic top view of the high voltage semiconductor device shown in FIG. 15.

In FIGS. 15-16, a schematic cross section and a schematic top view of another exemplary HV semiconductor device 100 are respectively illustrated. Herein, the HV semiconductor device 100 is modified from the HV semiconductor device 100 shown in FIGS. 9-10, and the reference numbers in the FIGS. 15-16 represent the same components. For the purpose of simplicity, only differences between the two embodiments are discussed in follows.

As shown in FIGS. 15-16, in this embodiment, the dummy gate structure S2, the insulating spacer 112 and the drift region 106 are only formed on one side (for example the right side) of the gate structure S1, and only the insulating spacer 114 and the doping region 122 without the drift region 106 are disposed on the other side (for example the left side) of the gate structure S1. The doping region 122 disposed in the drift region 106 may function as a drain of the HV semiconductor device 100. Therefore, a pitch D3 is still formed between the doping region 122 in the drift region 106 at the right side of the gate structure S1 and a sidewall of the gate structure S1, and a pitch D4 is still formed between the doping region 122 in the drift region 106 at the right side of the gate structure S1 and a sidewall of the conductive contact 130. In this embodiment, the sum (D3+D4) of the pitch D3 and the pitch D4 is about 50-80% that of the sum of the above described D1 and D2 (D1+D2) shown in FIGS. 1-2, such that a size of the active region S2 can be further reduced without changing the breakdown voltage of the HV semiconductor device 100, and the HV semiconductor device 100 may still have a breakdown voltage of, for example, about 10-30 V. The HV semiconductor device 100 shown in FIGS. 15-16 may still have the advantages and benefits which are similar with that of the HV semiconductor device 100 shown in FIGS. 9-10.

Figure 17:
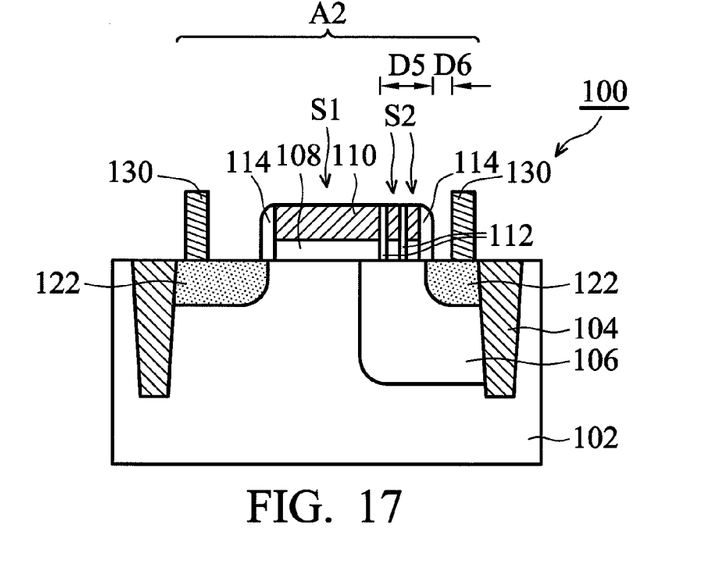
FIG. 17 is a schematic cross section of a high voltage semiconductor device according to yet another embodiment of the invention.
Figure 18:
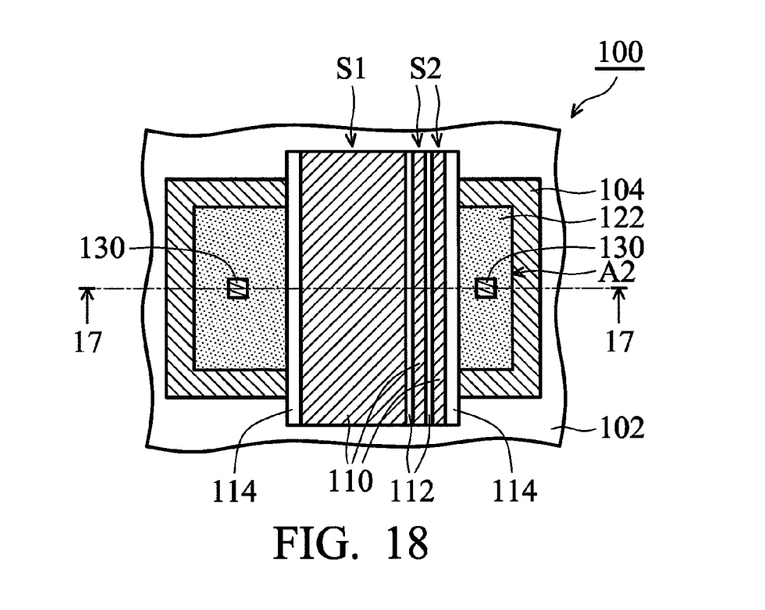
FIG. 18 is a schematic top view of the high voltage semiconductor device shown in FIG. 1.

In FIGS. 17-18, a schematic cross section and a schematic top view of another exemplary HV semiconductor device 100 are respectively illustrated. Herein, the HV semiconductor device 100 is modified from that shown in FIGS. 13-14, and the reference numbers in the FIGS. 17-18 represent the same components. For the purpose of simplicity, only differences between the two embodiments are discussed as follows.

As shown in FIGS. 17-18, in this embodiment, a plurality of dummy gate structures S2, the insulating spacer 112 and the drift region 106 are only formed on one side (for example the right side) of the gate structure S1, and only the insulating spacer 114 and the doping region 122 without the drift region 106 are disposed in the other side (for example the left side) of the gate structure S1. The doping region 122 in the drift region 106 may function as a drain of the HV semiconductor device 100. Therefore, a pitch D5 is still formed between the doping region 122 in the drift region 106 and a sidewall of the gate structure S1 at the right side of the gate structure S1, and a pitch D6 is still formed between the doping region 122 and a sidewall of the conductive contact 130 at the right side of the gate structure S1. The HV semiconductor device 100 may still have a breakdown voltage of, for example, about 10-30 V. The HV semiconductor device 100 shown in FIGS. 17-18 may still have the advantages and benefits which are similar with that of the HV semiconductor device 100 shown in FIGS. 13-14.

For the purpose of simplicity, the HV semiconductor devices shown in FIGS. 15-16 and 17-18 having asymmetry components disposed on opposite sides of the gate structure S1 can be fabricated by processes modified from the method disclosed in FIGS. 3-10 by deleting non-essential components at one side of the gate structure S1. Therefore, related fabrication methods for forming of the HV semiconductor devices shown in FIGS. 15-16 and 17-18 are not described and illustrated here again.

Figure 19:
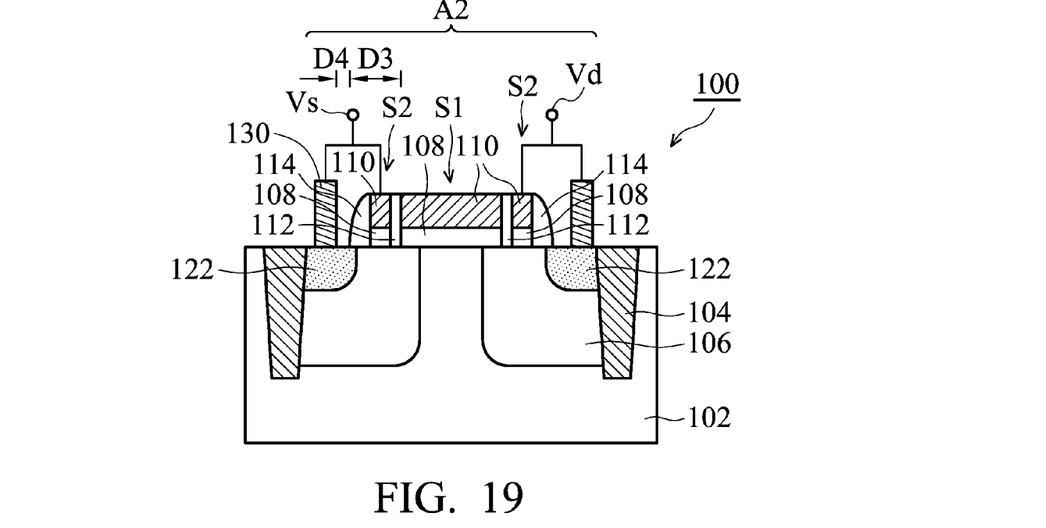
FIG. 19 is a schematic cross section showing electrical connections in a high voltage semiconductor device according to an embodiment of the invention.

During operation of the HV semiconductor device 100 shown in FIGS. 9-18, the dummy gate structure S2 in the composite spacer near a drain thereof can be coupled to any predetermined voltage or can be disconnected from any predetermined voltage, and thereby be floated. As shown in FIG. 19, in one embodiment, a doping region 122 which functions as a drain and a dummy gate structure S2 adjacent thereto can be coupled to a same voltage such as a drain voltage Vd by a sequentially formed interconnect structure (not shown). Similarly, during operation of the HV semiconductor device 100 shown in FIGS. 9-18, the dummy gate structure S2 in the composite spacer near a source thereof can be coupled to any predetermined voltage or can be disconnected from any predetermined voltage, an thereby be floated. As shown in FIG. 19, in another embodiment, a doping region 122 which functions as a source and a dummy gate structure S2 adjacent thereto can be coupled to a same voltage such as a source voltage Vs by a sequentially formed interconnect structure (not shown). The HV semiconductor device shown in FIG. 19 uses the HV semiconductor device 100 shown in FIGS. 9-10 as an example, and the same electrical connections shown in FIG. 19 can be also applied to the HV semiconductor devices 100 shown in FIGS. 11-18. Thus, related description and illustrations are not repeated herein for the purpose of simplicity.

Figure 20:
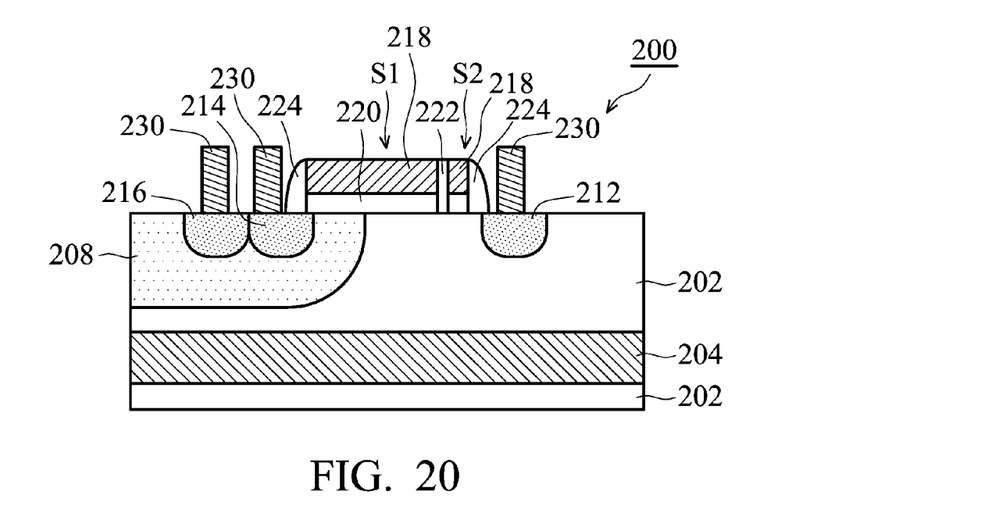
FIG. 20 is a schematic cross section of a high voltage semiconductor device according to another embodiment of the invention.

Referring to FIG. 20, a schematic cross section of another exemplary high voltage semiconductor device 200 is illustrated. Herein, the HV semiconductor device 200 uses the composite spacer disclosed in the HV semiconductor device 100 shown in FIGS. 9-18 on a drain side thereof, thereby having advantages and benefits which are the same as that of the HV semiconductor device 100 shown in FIGS. 9-18.

As shown in FIG. 20, the HV semiconductor device 200 is a lateral diffused metal-oxide-semiconductor (LDMOS) device, comprising a semiconductor substrate 202 having a first conductivity type (for example p-type), a doping region 204 of a second conductivity type (for example n-type) opposite to the first conductivity type embedded in a portion of the semiconductor substrate 202, and a body region 208 of the first conductivity disposed in different region in the semiconductor substrate 202. A doping region 216 having the first conductivity type and a doping region 214 having the second conductivity type is disposed in the body region 208, and a doping region 212 having the second conductivity type is disposed in the semiconductor substrate 202 at a side adjacent to the body region 208, and a conductive contact 230 is respectively disposed over the doping regions 212, 214 and 216. Moreover, a gate structure comprising a gate structure S1, a dummy gate structure S2, and a plurality of insulating spacers 222 and 224 is disposed over the semiconductor substrate 202. Herein, the doping region 212 functions as a drain and the doping region 214 functions as a source, and the gate structure adjacent to the doping region 212 comprises a composite spacer including the dummy gate structure S2 and the insulating spacers 222 and 224, and the gate structure adjacent to the doping region 214 comprises a spacer formed by the insulating spacer 224. The gate structure S1 and the dummy gate structure S2 are formed of a dielectric layer 218 and a conductive layer 220. In this embodiment, the doping regions 212 and 214, the gate structure S1, the dummy gate structure S2, the insulating spacers 222 and 224, and conductive contacts 230 are the same with the doping regions 212 and 214, the gate structure S1, the dummy gate structure S2, the insulating spacers 222 and 224, and conductive contacts 230 of the HV semiconductor device 100 shown in FIGS. 9-18. Therefore, the HV semiconductor device 200 may have the advantages and benefits which are similar with that of the HV semiconductor device 100.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high voltage (HV) semiconductor device, comprising:
a semiconductor substrate having a first conductivity type;
a gate structure disposed over a portion of the semiconductor substrate;
a pair of spacers respectively disposed over a sidewall of the gate structure, wherein one of the spacers is a composite spacer comprising a first insulating spacer contacting the gate structure, a dummy gate structure, and a second insulating spacer;
a first drift region disposed in a portion of the semiconductor, underlying a portion of the gate structure and one of the pair of spacers, having a second conductivity type opposite to the first conductivity type, wherein the first drift region physically contacts the first insulating spacer and the second insulating spacer of the composite spacer; and
a pair of doping regions, respectively disposed in a portion of the semiconductor substrate on opposite sides of the gate structure, wherein the pair of doping regions comprise the second conductivity type and one of the doping regions is disposed in the first drift region.

2. The HV semiconductor device as claimed in claim 1, wherein the dummy gate structure shows a strip configuration from a top view, and shows a rectangular configuration from a cross section view.

3. The HV semiconductor device as claimed in claim 1, wherein the gate structure and the dummy gate structure comprise a dielectric layer and a conductive layer formed over the dielectric layer.

4. The HV semiconductor device as claimed in claim 1, wherein the other one of the pair of spacers is also the composite spacer comprising the first insulating spacer contacting the gate structure, the dummy gate structure, and the second insulating spacer.

5. The HV semiconductor device as claimed in claim 4, further comprising a second drift region disposed in a portion of the semiconductor substrate, underlying a portion of the gate structure and the other one of the pair of spacers, having a second conductivity type opposite to the first conductivity type, wherein the other one of pair of doping regions is disposed in a portion of the second drift region.

6. The HV semiconductor device as claimed in claim 1, wherein the composite spacer comprises a plurality of first insulating spacers contacting the gate structure, a plurality of dummy gate structures and a second insulating spacer, wherein the first insulating spacers are respectively disposed between the dummy gate structures, between the dummy gate structures and the second insulating spacer, and between the dummy gate structures and the gate structure.

7. The HV semiconductor device as claimed in claim 5, wherein the composite spacer comprises a plurality of first insulating spacers contacting the gate structure, a plurality of dummy gate structures and a second insulating spacer, wherein the first insulating spacers are respectively disposed between the dummy gate structures, between the dummy gate structures and the second insulating spacer, and between the dummy gate structures and the gate structure.

8. A method for fabricating a high voltage semiconductor device, comprising:
providing a semiconductor substrate, having a first conductivity type;
forming a drift region in a portion of the semiconductor substrate, wherein the drift region has a second conductivity type opposite to the first conductivity type;
forming a gate structure and a dummy gate structure over the semiconductor substrate, wherein the gate structure partially covers the drift region, and the dummy gate structure is disposed over the drift region;
forming a first insulating spacer and a pair of second insulating spacers, wherein the first insulating spacer is located between the gate structure and the dummy structure, and the second insulating spacers are respectively disposed over a sidewall of the dummy gate structure, and the drift region physically contacts the first insulating spacer and one of the second insulating spacers;
performing an ion implanting process to form two doping regions in the semiconductor substrate adjacent to the second insulating spacers,
wherein the doping regions have the second conductivity type, and one of the doping regions is formed in the drift region; and
performing an annealing process.

9. The method as claimed in claim 8, wherein the doping regions have a dopant concentration greater than a dopant concentration of the drift region.

10. The method as claimed in claim 8, wherein the dummy gate structure shows a strip configuration from a top view, and shows a rectangular configuration from a cross section view.

11. The method as claimed in claim 8, wherein the gate structure and the dummy gate structure comprise a dielectric layer and a conductive layer formed over the dielectric layer.

12. The method as claimed in claim 8, wherein the first insulating spacer, the dummy gate structure, and the second insulating spacer form a composite spacer.

13. A method for fabricating a high voltage semiconductor device, comprising:
providing a semiconductor substrate, having a first conductivity type;
forming a pair of drift regions in two different portions of the semiconductor substrate, wherein the drift regions have a second conductivity type opposite to the first conductivity type;
forming a gate structure and a plurality of dummy gate structures over the semiconductor substrate, wherein the gate structure partially covers a portion of the drift regions and the dummy gate structures are respectively disposed over one of the drift regions;
forming a first insulating spacer and a pair of second insulating spacers, wherein the first insulating spacer is located between the gate structure and the dummy structures, and the second insulating spacers are respectively disposed over a sidewall of the dummy gate structures, and each of the drift regions physically contacts the first insulating spacer and one of the second insulating spacers;

performing an ion implanting process to form two doping regions in the semiconductor substrate adjacent to the second insulating spacers, wherein the doping regions have the second conductivity type, and the doping regions is respectively disposed in one of the drift regions; and performing an annealing process.

14. The method as claimed in claim 13, wherein the gate structure and the dummy gate structures comprise a dielectric layer and a conductive layer formed over the dielectric layer.

15. The method as claimed in claim 13, wherein the first insulating spacer, one of the dummy gate structures, and the second insulating spacer form a composite spacer.

\* \* \* \* \*